(12) United States Patent  (10) Patent No.: US 7,196,922 B2
Lysinger  (45) Date of Patent: Mar. 27, 2007

(54) PROGRAMMABLE PRIORITY ENCODER

(75) Inventor: Mark Lysinger, Carrollton, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 11/188,396

(22) Filed: Jul. 25, 2005

(65) Prior Publication Data

US 2007/0019455 A1    Jan. 25, 2007

(51) Int. Cl.
*G11C 15/00* (2006.01)
*G11C 7/00* (2006.01)
(52) U.S. Cl. ............... 365/49; 365/189.07; 365/189.08
(58) Field of Classification Search ................. 365/49, 365/189.07, 189.08
See application file for complete search history.

(56) References Cited

U.S. PATENT DOCUMENTS

| | | | |
|---|---|---|---|
| 6,191,969 B1 * | 2/2001 | Pereira ......................... 365/49 |
| 6,400,592 B1 * | 6/2002 | Peterson ....................... 365/49 |
| 6,411,236 B1 | 6/2002 | Kermani ...................... 341/141 |
| 6,678,184 B2 | 1/2004 | Lysinger et al. ............... 365/49 |
| 6,687,785 B1 | 2/2004 | Pereira ........................ 711/108 |
| 6,732,227 B1 | 5/2004 | Baumann ..................... 711/108 |
| 6,765,408 B2 | 7/2004 | Cheng et al. .................. 326/41 |
| 6,792,502 B1 | 9/2004 | Pandya et al. ............... 711/108 |
| 6,842,360 B1 * | 1/2005 | Srinivasan .................... 365/49 |
| 6,856,529 B1 * | 2/2005 | Radke .......................... 365/49 |
| 6,903,953 B2 * | 6/2005 | Khanna ........................ 365/49 |
| 6,972,978 B1 * | 12/2005 | Miller et al. .................. 365/49 |
| 6,978,343 B1 * | 12/2005 | Ichiriu ......................... 365/49 |
| 7,006,368 B2 * | 2/2006 | Arsovski et al. .............. 365/49 |
| 2003/0005146 A1 | 1/2003 | Miller et al. ................. 709/238 |
| 2004/0012989 A1 | 1/2004 | Park et al. ..................... 365/49 |
| 2004/0052134 A1 | 3/2004 | Batson et al. ............... 365/202 |
| 2004/0128437 A1 | 7/2004 | Regev et al. ............... 711/108 |
| 2004/0128440 A1 | 7/2004 | Regev et al. ............... 711/108 |

* cited by examiner

*Primary Examiner*—Trong Phan
(74) *Attorney, Agent, or Firm*—Lisa K. Jorgenson; Christopher F. Regan

(57) ABSTRACT

A programmable priority encoder is disclosed for use with the device such as a Content Addressable Memory (CAM) device having a plurality of array objects to be encoded in binary and arranged in row and columns. Match lines are adapted to be connected to a plurality of arrayed objects associated with respective rows. A plurality of encoder cells, each having a memory element and forming an encoder block are arranged in rows. Precharged bus lines are operative with the encoder cells and match lines. The precharged bus lines are discharged indicating a match and priority is assigned to rows based on logic values stored within the memory elements of the encoder cell.

29 Claims, 12 Drawing Sheets

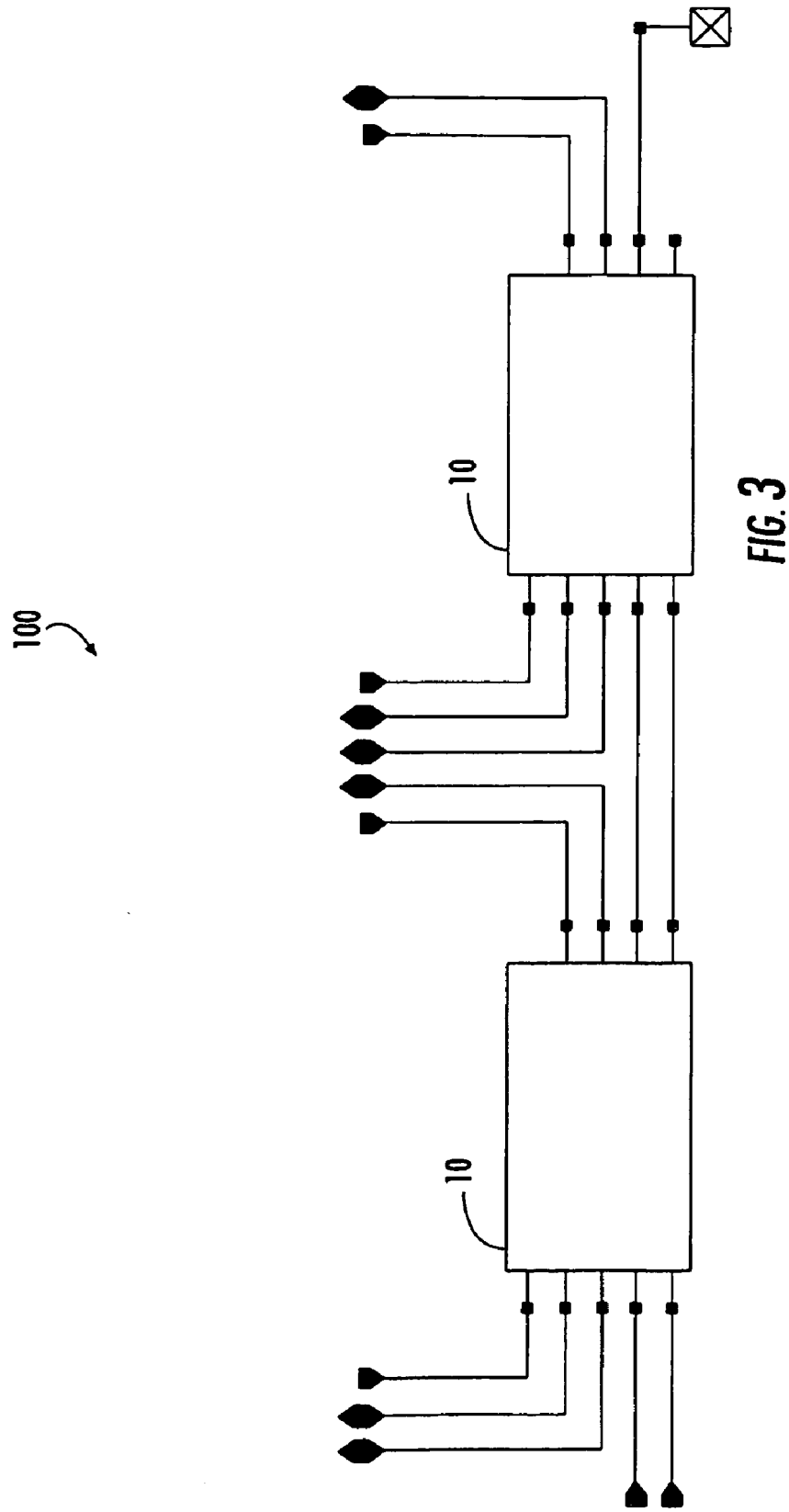

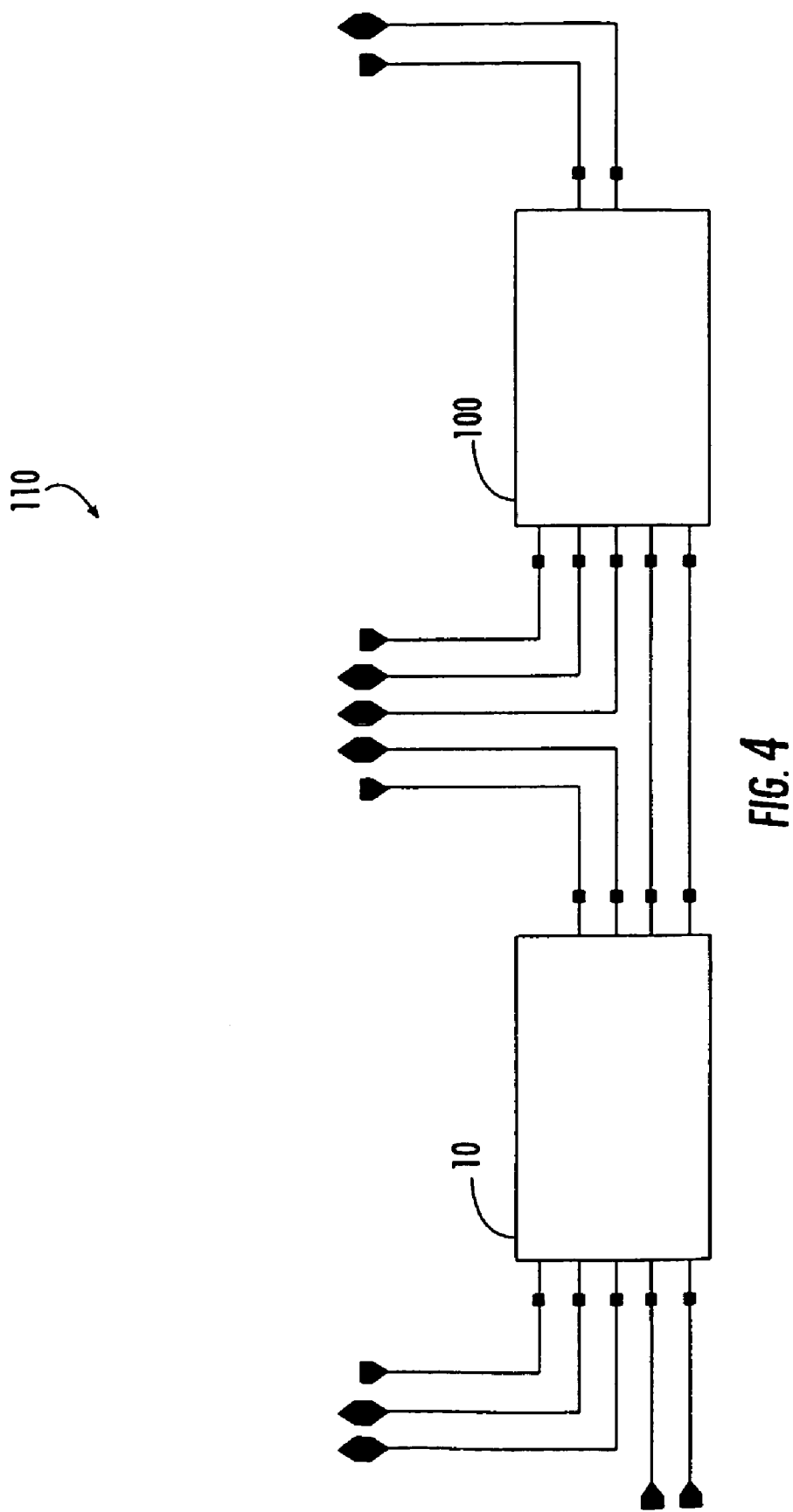

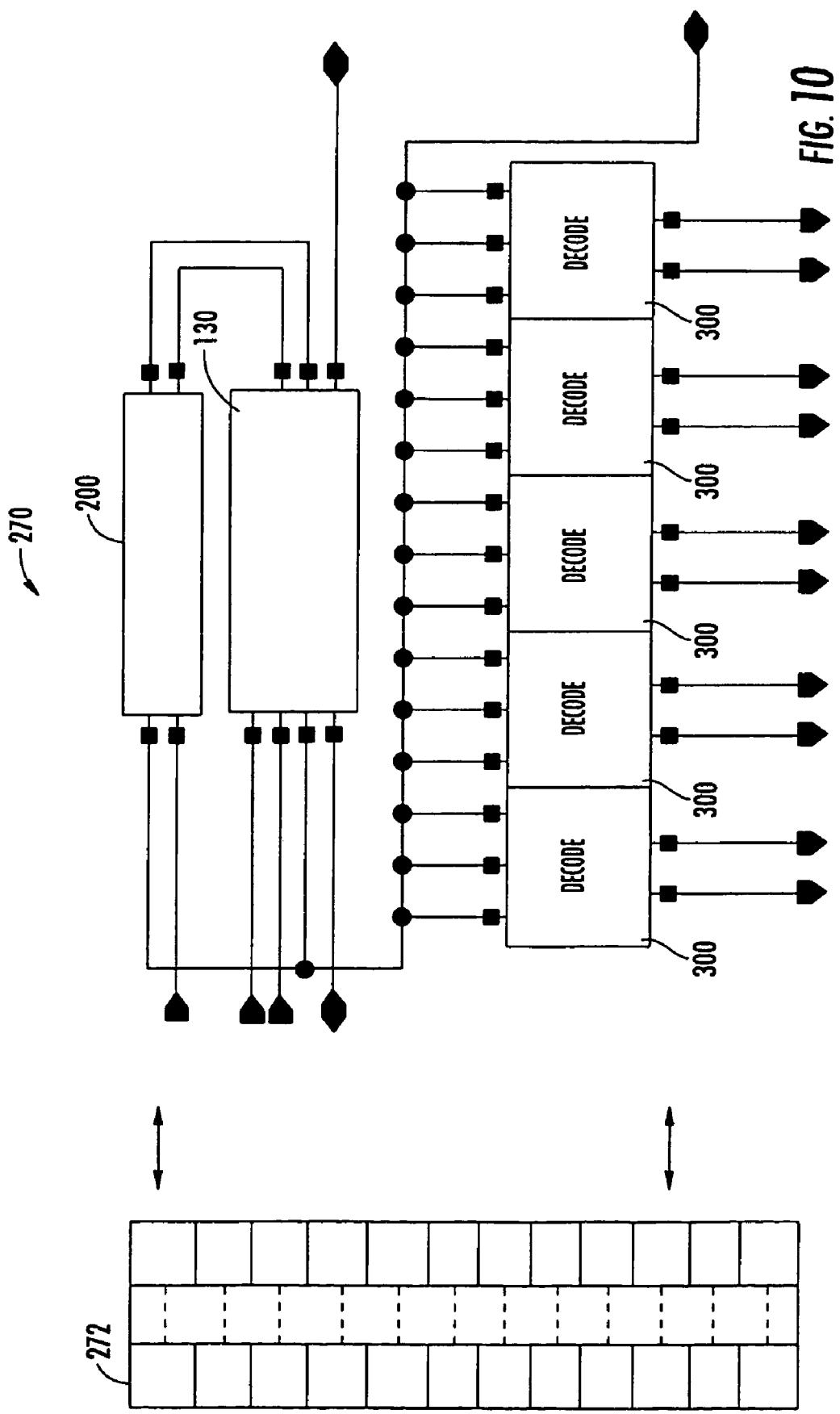

PROGRAMMABLE PRIORITY ENCODER

FIELD OF THE INVENTION

The present invention relates to the Content-Addressable Memory (CAM) devices, more particularly, the present invention relates to a programmable priority encoder used for a Content-Addressable Memory (CAM) device.

BACKGROUND OF THE INVENTION

Content-Addressable Memories (CAMs) use semi-conductor memory components such as Static Random Access Memory (SRAM) circuits and additional comparison circuitry that permits any required searches to be completed in a single clock cycle. Searches using Content-Addressable Memories and associated comparison circuitry are typically faster than algorithmic searches. Because Content-Addressable Memories are faster, they are often used in Internet routers for complicated address look-up functions. They are also used in database accelerators, data compression applications, neural networks, Translation Look-aside Buffers (TLB) and processor caches.

In a Content-Addressable Memory, any data is typically stored randomly in different memory locations, which are selected by an address bus. Data is also typically written directly into a first entry or memory location. Each memory location could have associated with the memory a pair of special status bits that keep track of whether the memory location includes valid data or is empty and available for overriding. Any information stored at a specific memory location is located by comparing every bit in memory with any data placed in a comparand register. A match flag is asserted to allow a user to know that the data is in memory. Priority encoders sort the matching locations by priority and make address-matching location available to a user.

As compared to more standard memory address circuits, in a Content-Addressable Memory circuit data is supplied and an address obtained, and thus, address lines are not required. A router address look-up search examines a destination address for incoming packets and the address look-up table to find an appropriate output port. This algorithm and circuitry involves longest-prefix matching and uses the Internet Protocol (IP) networking standard.

Current routing tables have about 30,000 entries or more and the number of entries is increasing growing rapidly. Terabit-class routers perform hundreds of millions of searches per second and update routing tables thousands of times per second. Because of present and future projected routing requirements, Content-Addressable Memories are used to complete a search in a single cycle. In these circuits, comparison circuitry is usually added to every CAM memory cell, forming a parallel look-up engine. The CAM memory cells can be arranged in horizontal words, such as four horizontal words that are each five bits long. The cells contain both storage and comparison circuitry. Search lines run vertically and broadcast search data to the CAM cells. Match lines run horizontally across the array and indicate whether a search data matches the word in the row. An activated match line indicates a match, and a deactivated match line indicates a non-match or mismatch. The match lines are input to the priority encoder which generates an address corresponding to a match location.

Typically, a search will begin by pre-charging high all match lines in a matched state. Data is broadcast by drivers onto search lines. The CAM cells compare the stored bit against a bit on corresponding search lines. Any cells that match data do not affect match lines, but any cells with a mismatch would pull-down a match line for any word that has at least one mismatch. Other match lines without mismatches remain precharged high.

The priority encoder will generate a search address location for any matching data. For example, an encoder could select numerically the smallest numbered match line for two activated match lines and generate a match address, for example 01. This can be input to a RAM that contains output ports. The match address output is a pointer that retrieves associated data from RAM. An SRAM cell could include positive feedback in a back-to-back inverter with two access transistors connecting bit lines to storage nodes under control of a word line. Data is written or read into and from a cell through the bit lines. Mismatches result in discharged match lines and power consumption is the result. There are more mismatches typically than matches.

The circuit can be arrayed to handle a number of binary divisible row locations. A column structure can be hierarchical in nature. In a CAM application, it is sometimes necessary to encode one or more row locations. Because only one location can typically be encoded at a time, the locations are prioritized and the highest priorities are encoded. The priority can be set based on a physical order. CAM devices typically require a physical prioritization. Usually a priority encoder is done with many stages of combinational logic. These priority encoders often use a circuit requiring a large footprint and often limits performance.

Copending, commonly assigned U.S. patent application Ser. No. 11/134,890 by the same inventor, the disclosure which is hereby incorporated by reference in its entirety, discloses an improved physical priority encoder that is advantageous over priority encoders that use many stages of combinational logic. Instead, this physical priority encoder uses precharged circuits that include precharged bus lines and physical priority ordering, based on a top down approach, resulting in a small footprint. In this disclosed physical priority encoder, precharged bus lines are used as dynamic circuits, which result in higher performance in a smaller footprint. When this physical priority encoder is operative with a Content-Addressable Memory (CAM), each row can produce a match signal indicating that compare data is matched to the row data. A 4-bit priority encoder can be built using a 2-bit encoder footprint. Additional arrayed blocks can be cascaded and precharged bus lines and operative to aid in converting bus priorities to usable binary addresses.

In this type of described system, a Content-Addressable Memory (CAM) device would include an array of CAM cells arranged in columns and rows. Each row would have a match signal indicative that compare data has matched data within the respective row. This physical priority encoder is operatively connected to this array of CAM cells and determines a highest priority matching address for data within the array of CAM cells. Match lines are associated with respective rows and precharged bus lines are connected into respective match lines that are discharged whenever there is a match signal, such that the highest precharged bus line that is discharged results in an encoded address.

The priority encoder includes a plurality of n-bit encoder circuits that are cascaded together to accommodate the number of address bits as necessary for the array of CAM cells. Carry signals on a most significant n-bit encoder circuit feed match lines on less significant cascaded n-bit encoder circuits. A logic circuit can be used for inhibiting a carry operation or allowing a carry operation to the next cascaded encoder circuit.

An n-bit encoder circuit can be formed as a 2-bit encoder circuit having four rows. Precharged bus lines can be charged high at the beginning of an encoding cycle. Each match line can be formed as a pull-down transistor that discharges a precharged bus line when a match signal on a match line is high. Each pull-down transistor can also be formed as a gate connected to a respective match line, a source connected to ground, and a drain connected to a respective precharged bus line. Match lines can also be ordered in priority of bit addresses with the most significant bit addresses followed by least significant bit addresses. A precharge circuit can also be operatively connected to the precharged bus lines for charging the precharged bus lines high at the beginning of an encoding cycle. Each precharge circuit can comprise a transistor that pulls each precharged bus line to VDD at the beginning of an encoding cycle.

Although this disclosed physical priority encoder uses a top down approach and saves physical space, the array of objects are still addressed in a physical order. It would be advantageous if the objects could have a physical position overwritten based on a programmed order. In some physical priority encoders, rows would have to be shuffled physically if the priority of that row changes. It would be more advantageous if a programmable approach were used for this type of described system.

SUMMARY OF THE INVENTION

In accordance with one aspect and non-limiting example of the invention, a Content Addressable Memory (CAM) device includes an array of CAM cells arranged in rows and columns, with each row operative to produce a match signal indicative that compare data has matched data within a respective row. A programmable priority encoder is operatively connected to the array of CAM cells for allowing priority to be assigned. The programmable priority encoder includes a plurality of encoder cells, each having a memory element and forming an encoder block and arranged in rows. Match lines and precharged bus lines are operative with the respective encoder cells and the precharged bus lines are operative with the match lines. The precharged bus lines are discharged indicating a match and priority is assigned to rows based on logic values stored within memory elements of the encoder cells.

The programmable priority encoder can also be formed as a plurality of n-bit encoder blocks that are cascaded together. Each memory element can be formed as an SRAM cell. Each encoder cell further includes a word line (WL), a bit line compliment (BLC), and a bit line true (BLT) signal line, each operative with the memory element. Each encoder cell can also include a discharge circuit to ground and operative for receiving a precharged bus signal on the precharged bus line when a memory element associated therewith has a logic one and a match has occurred. The discharge circuit can be formed as series connected transistors.

In yet another aspect, each encoder cell can be formed as an AND/OR logic circuit operatively connected to the memory element for allowing a carry signal based on precharged bus line and memory element values. Each encoder cell could also be formed as a buffer circuit associated with the memory element for buffering the values stored within the memory element. A precharged circuit can be operatively connected to the precharged bus line for precharging the precharged bus lines and could be formed as a precharged cell associated with each precharged bus line. The precharged cells can be cascaded together.

In yet another aspect, a programmable priority encoder for use with a device having a plurality of array objects to be encoded in binary and arranged in rows and columns is set forth.

BRIEF DESCRIPTION OF THE DRAWINGS

FIG. 3 is a high-level block diagram of a 4-bit programmable priority encoder block.

FIG. 4 is a high-level block diagram of a 6-bit programmable priority encoder block.

FIG. 10 is a high-level block diagram of the 10-bit programmable priority encoder using various decode circuits; 2-bit priority encoder precharge cell, and 10-bit priority encoder block.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
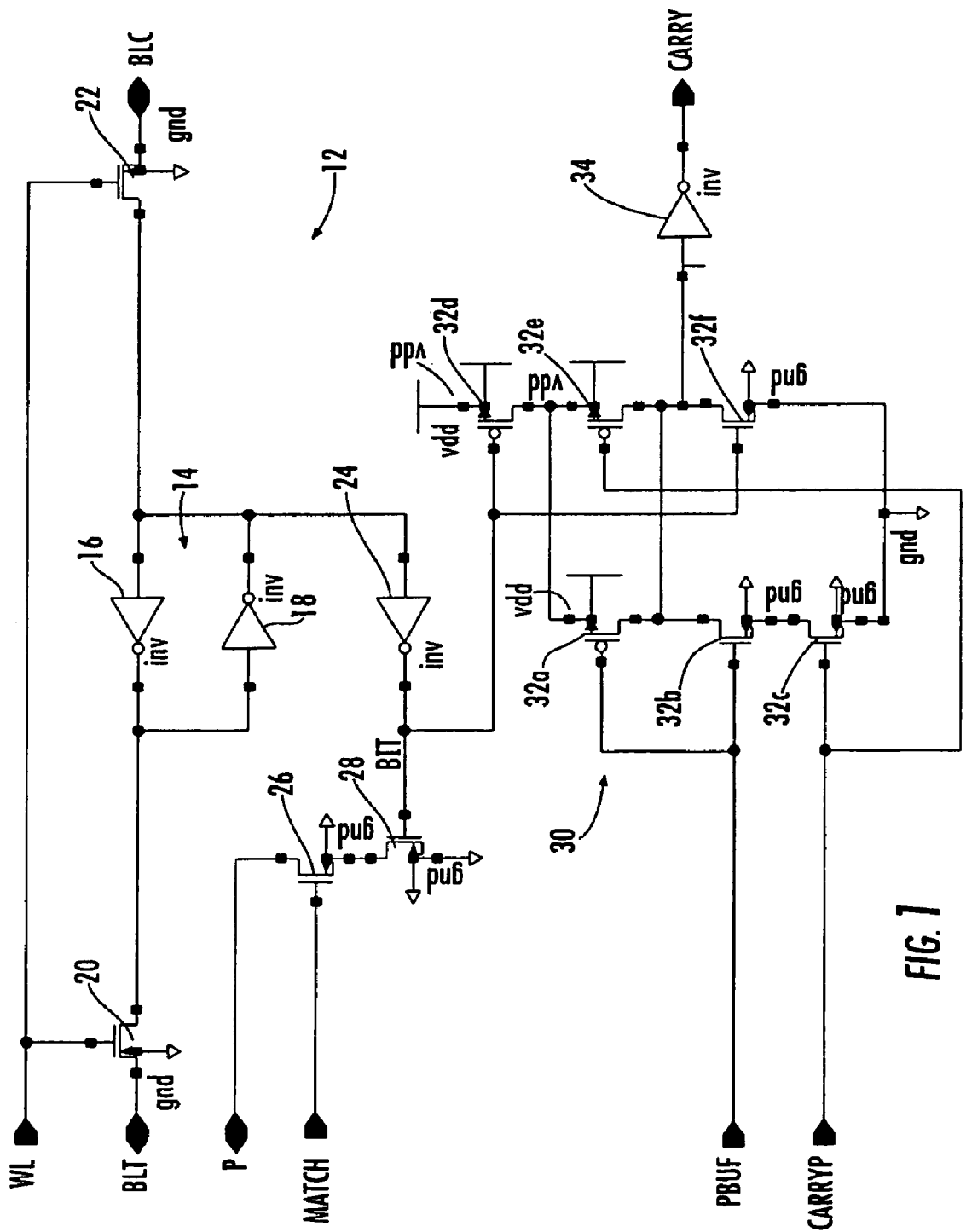
FIG. 1 is a schematic circuit diagram of one example of a priority encoder cell that can be used in combination with a programmable priority encoder of the present invention.
Figure 2A:
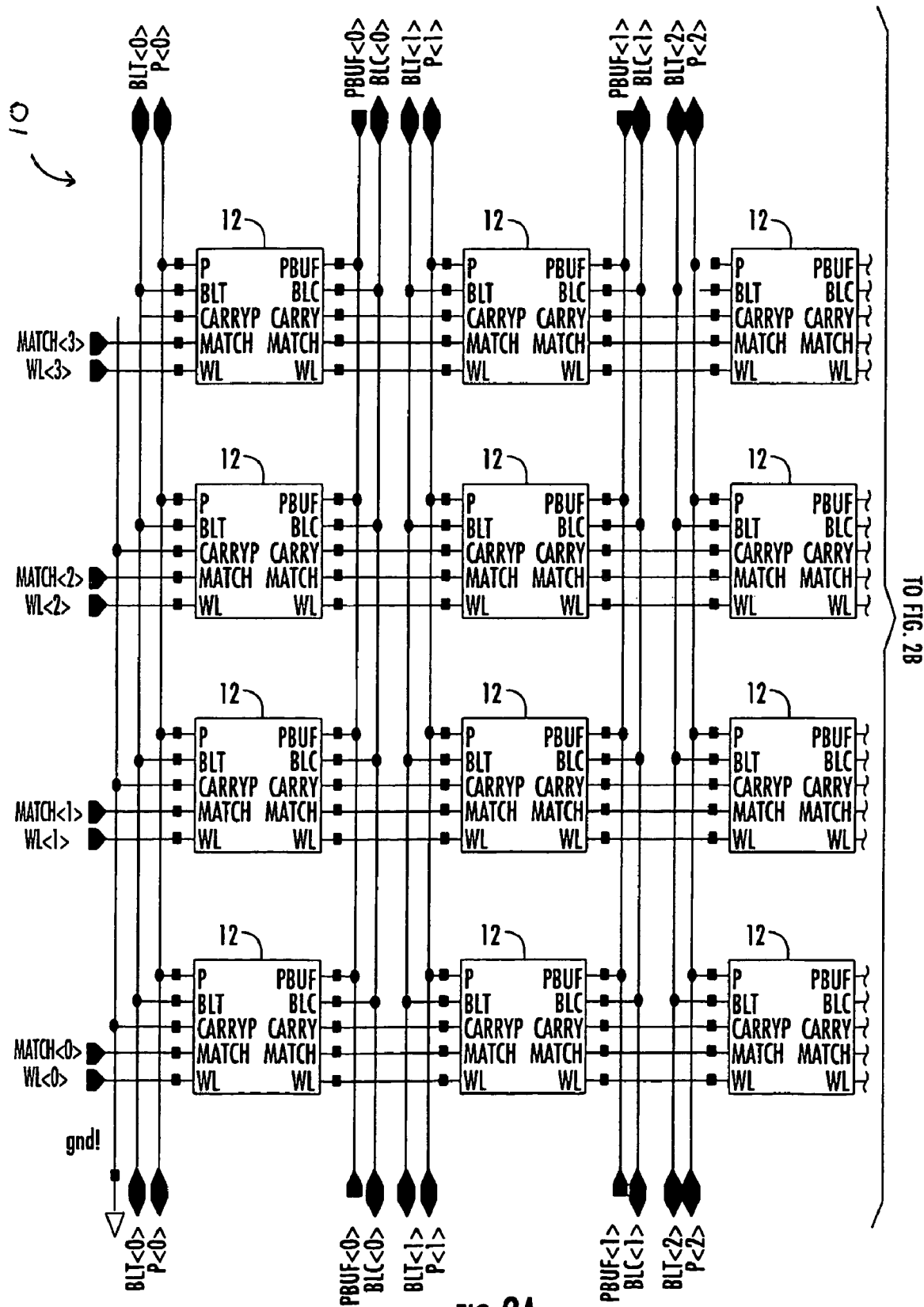
FIGS. 2A–B are schematic circuit block diagrams of a 2-bit priority encoder by four rows that can be used as a programmable priority encoder block in accordance with one embodiment of the present invention.
Figure 2B:
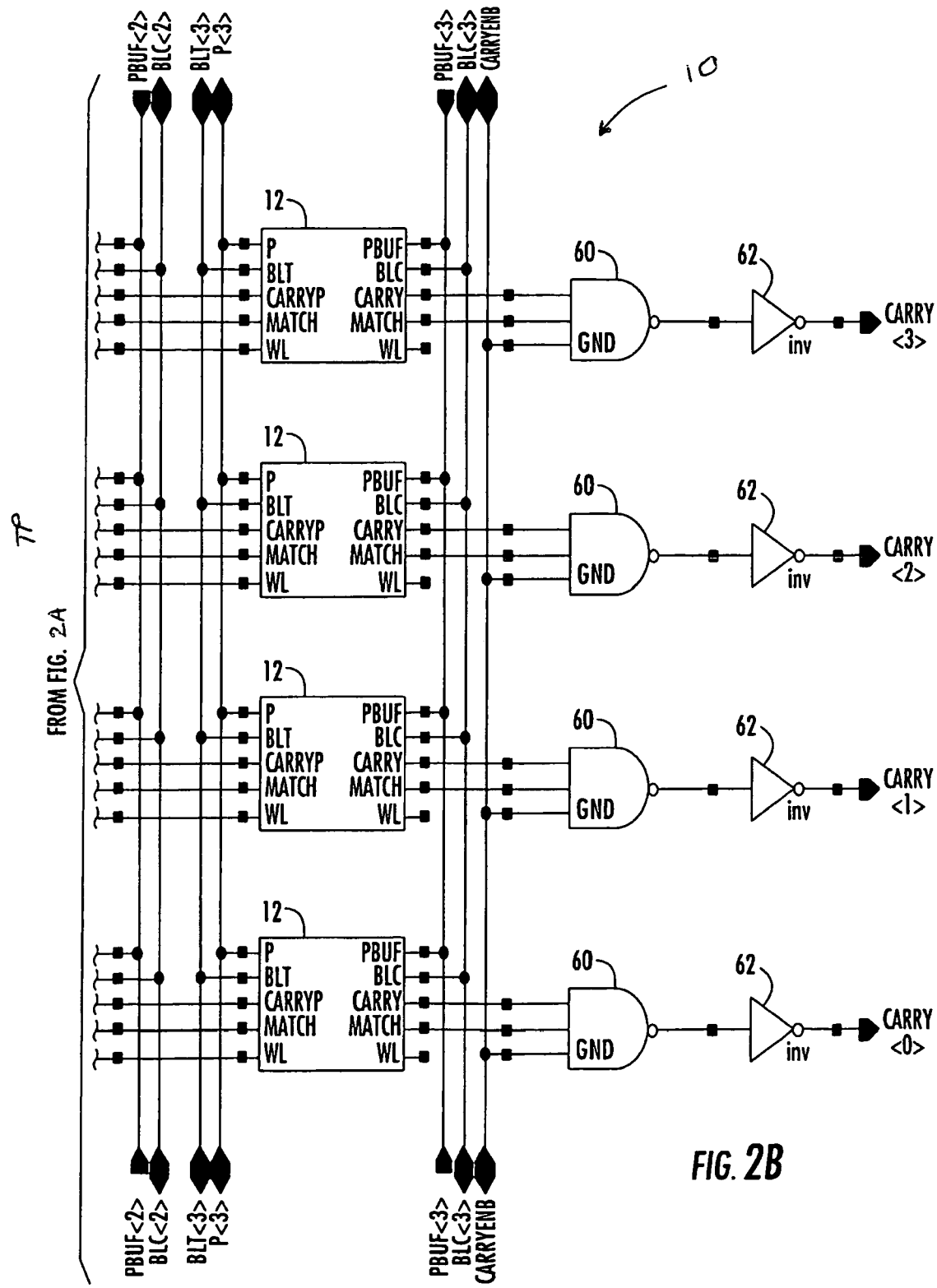

Referring now to the schematic circuit diagram of FIG. 1, there is illustrated a priority encoder cell 12 used in the programmable priority encoder block 10 such as shown in FIGS. 2A–B, which is used in combination with other elements to form a complete programmable priority encoder 270 shown in FIG. 10. The programmable priority encoder 270 could be operative as a Content Addressable Memory (CAM) device that includes an array of CAM cells 272 arranged in columns and rows. The internal state of a memory cell within a priority encoder cell could dictate priority instead of position as in a positional priority encoder.

The top of the schematic of FIG. 1 shows a typical six transistor SRAM cell 14, although only two cross coupled inverters 16 and 18 are shown corresponding to the memory element. Although an SRAM cell is described throughout, other memory cells and elements could be used and alternative memory designs would be feasible. Bit line true (BLT) and compliment (BLC) together with the word line (WL) complete the interface to the SRAM cell 14. The two cross-coupled inverters 16 and 18 store the cell value and two n-channel transistors 20 and 22 allow the memory cell 14 to be read and written externally.

An additional inverter 24 buffers the stored value (BIT) in the SRAM memory cell 14 to the reset of the priority cell 12. The two series n-channel transistors 26 and 28 connect to the respective precharge (P) and match lines and provide a discharge path to ground for the column (P) signal when both the SRAM cell 14 has a logic 1 and a match has occurred. For purposes of comparison, in the incorporated by reference '890 application, the disclosed physical priority encoder has its (P) signal precharged to a logic 1 level prior to the commencement of encoding.

The signal (BIT) is also input to a complex gate 30 formed by six transistors 32a–f and an inverter 34. This gate 30 functions as an AND/OR logic circuit. If (BIT) is a logic 1 then (CARRY) is logic 1. If (BIT) is a logic 0 and both (PBUF) and (CARRYP) signals are a logic 1 then (CARRY) will again be a logic 1. All other combinations result in (CARRY) being a logic 0. The (PBUF) signal is a buffered version of (P) and has the same state.

The sixteen different priority encoder cells 12 are shown in the four-row/two bit programmable priority encoder block 10 of FIGS. 2A–2B. This circuit 10 is formed as a four by four circuit structure. This programmable priority encoder is more complicated then a four by four physical priority encoder as disclosed in the '890 application, because in the programmable priority encoder, any priority can be assigned to any row. With a physical priority encoder, a top row is fixed as the highest priority with priorities going down with each successive row. If this programmable priority encoder was programmed in this top down fashion, then this schematic shown in FIG. 2 would reduce down to that of a physical priority encoder as disclosed in the '890 application.

The programmable priority encoder allows greater flexibility of how priority is assigned. A priority can be assigned to each of the four rows. If a row is to be the highest priority, then the SRAM storage cell 14 within the priority cell three on that row has a logic 1 stored in it and the other three SRAM cells with priority cells on the row has a logic 0 stored. It should be noted that the programmable priority encoder as described uses the memory cell for programming as explained in greater detail below.

If the next highest priority is to be assigned to the row, then cell two has logic 1, and the other three cells have logic 0. If the second lowest priority is to be assigned to the row, then cell one has a stored logic 1, while the other three cells have a logic 0.

In the illustrated programmable priority encoder 10 shown in FIGS. 2A–B, each of the four rows should be programmed with a different priority if a unique result is desired. It is possible to program the same priority into two different rows, but if both rows match, both will be carried, and there will not be a unique result. This is the case when more than four rows are encoded. As shown in FIGS. 1 and 2A–B, the architecture of this two-bit programmable priority encoder 10 forms a complete architectural circuit block and has common signals running vertically and horizontally. The precharge (P) signals are vertical and stitch the columns together, and the match lines are horizontal and stitch the rows together. Along a row the SRAM word lines (WL) and the MATCH signals pass through. The CARRYP signal is driven by the previous CARRY signal. CARRYP should be set to ground of the first bit. Along the column the bit lines BLT and BLC pass through. The Priority Line (P) and its buffered equivalent (PBUF) also pass through.

An advantageous, but nonlimiting configuration for the number of P signals was found to be four (P) signals representing 2 bits. Eight (P) signals with 3 binary bits (or more) could be used in some cases. Even more (P) signals could be used, but 4 to 8 have been found advantageous.

In operation, an SRAM cell 14 (e.g., at top center) is loaded with priority data for that circuit. Because the string of cascaded circuits will be decoded from the binary priority value, only one of the SRAM cells 14 within the row will have a logic 1 stored. The others will have logic 0.

When a search is engaged, any number of match lines will be asserted (from 0 to the maximum number of entries). All (P) lines will have been precharged to logic 1.

| P0 | P1 | P2 | P3 |
|----|----|----|----|
| 1  | 1  | 1  | 1  |

For description, an example is now described when three matches are asserted within the block of four rows. Two rows that matched have a priority of 3, and one row that matched has a priority of 1. The row with a miss was programmed priority 0. The table below shows the programming of the SRAM cells 14 and the Match status.

| Physical Row | BIT0 | BIT1 | BIT2 | BIT3 | PROGRAMMABLE PRIORITY | MATCH |
|---|---|---|---|---|---|---|
| 3 | 0 | 1 | 0 | 0 | 1 | 1 |
| 2 | 0 | 0 | 0 | 1 | 3 | 1 |
| 1 | 1 | 0 | 0 | 0 | 0 | 0 |
| 0 | 0 | 0 | 0 | 1 | 3 | 1 |

The two matches that are priority 3 both discharge P3 through the two sets of series n-channel transistors 20 and 22 shown in FIG. 1. The other match programmed priority 1 will discharge P1 through its series of n-channel transistors. Of the 4 priority line columns P3 to P0, only priority 3 and 1 are discharged. P0 and P2 remain at logic 1.

| P0 | P1 | P2 | P3 |
|----|----|----|----|
| 1  | 0  | 1  | 0  |

The truth table for the compare logic is as follows:

| BIT | PBUF (P) | CARRY P | CARRY |
|---|---|---|---|
| 0 | 0 | 0 | 0 |
| 0 | 0 | 1 | 0 |
| 0 | 1 | 0 | 0 |
| 0 | 1 | 1 | 1 |
| 1 | 0 | 0 | 1 |
| 1 | 0 | 1 | 1 |
| 1 | 1 | 0 | 1 |
| 1 | 1 | 1 | 1 |

The following table shows the CARRY results:

| Physical Row | CARRY −1 | CARRY 0 | CARRY 1 | CARRY 2 | CARRY 3 | PROGRAMMED PRIORITY | MATCH |
|---|---|---|---|---|---|---|---|
| 3 | 0 | 0 | 1 | 1 | 0 | 1 | 1 |
| 2 | 0 | 0 | 0 | 0 | 1 | 3 | 1 |
| 1 | 0 | 1 | 0 | 0 | 0 | 0 | 0 |
| 0 | 0 | 0 | 0 | 0 | 1 | 3 | 1 |

The carry input from the first circuit (CARRY−1) on each row is grounded. With the exception of the physical row 1 which is programmed priority 0 (BIT=1), the CARRY output of the cells with SRAM BIT=0 will all resolve to a logic 0 because CARRYP is a logic 0 and the output of the SRAM (BIT) is a logic 0. The programmed physical row 1 will have a CARRY of logic 1.

With priority line P1, there are two possible situations. A first is physical row 3 having the cell 1 priority bit set to a logic 1. As noted from the explanation above, P1 and therefore PBUF1 is a logic 0, and SRAM BIT is a logic 1. CARRY resolves to a logic 1. For all other rows, the SRAM BIT is a logic 0, and CARRY resolves to a logic 0 regardless of the state of CARRYP.

P2 is not discharged. Thus, the circuit resolution is similar to that of physical row 3 of P0, with the exception of the row that has CARRYP set to logic 1. P2 is also logic 1. The result is that CARRY is a logic 1 so the priority is carried forward for that row.

With P3 there are two matches. Physical row 3 has a CARRYP of logic 1. Unlike the state of P2, P3 is a logic 0. This blocks the CARRYP signal and the output CARRY is now dependent on the state of the SRAM cell. Because only one SRAM cell can be set to one in a row and this row had the first SRAM Bit set, the output of the third SRAM cell is a logic 0. The resulting CARRY signal for the row is logic 0.

The two rows that had SRAM cells set to one in the third priority column result in a CARRY output of one. The output of CARRYP and PBUF is irrelevant at this time. Row 1 has CARRYP at zero and the SRAM cell at zero. The resulting CARRY signals are all zero.

This is the end of the cascade. At this point all row CARRY signals are ANDED in a logic operation with their rows having a match signal to produce a new match signal and an enable signal, which is used for timing purposes.

In this nonlimiting example, two matches are passed through and one is inhibited. Had the priorities been unique, then only one match would be passed on. With two matches passed on to the next encoder, further resolution will be required to obtain a unique result.

As also illustrated, each row includes a NAND gate 60 and inverter circuit 62 allowing the CARRY as illustrated. Other logic circuits could be used, of course, depending on the particular chosen design.

FIG. 3 is a high-level block diagram of a cascaded set of programmable priority encoder blocks 10 as described with reference to FIGS. 2A–B and forming a 4-bit programmable priority encoder 100. Two programmable priority encoder blocks 10 are cascaded.

In this sixteen row (4 bit) encoder, each row will have four most significant SRAM cells to be programmed, followed by four least significant SRAM cells to program. As long as the combination of the two sets of programming are unique within the sixteen rows, there will be a unique result. In this cascaded example, two or more of the rows within the most significant section or the least significant section will have the same programming.

A truth table is shown below:

| Most Significant | Two Bits | Least Significant | Two Bits | Priority |
|---|---|---|---|---|
| 1 | 0 | 0 | 1 | 2 (4) + 1 = 9 |
| 1 | 1 | 1 | 0 | 3 (4) + 2 = 14 |
| 0 | 0 | 1 | 0 | 0 (4) + 2 = 2 |
| 0 | 1 | 1 | 1 | 1 (4) + 3 = 7 |
| 1 | 1 | 0 | 0 | 3 (4) + 0 = 12 |
| 1 | 1 | 1 | 1 | 3 (4) + 3 = 15 |
| 0 | 1 | 0 | 0 | 1 (4) + 0 = 4 |
| 0 | 0 | 0 | 1 | 0 (4) + 1 = 1 |
| 0 | 1 | 1 | 0 | 1 (4) + 2 = 6 |
| 1 | 1 | 0 | 1 | 3 (4) + 1 = 13 |
| 0 | 0 | 1 | 1 | 0 (4) + 3 = 3 |
| 1 | 0 | 1 | 1 | 2 (4) + 3 = 11 |
| 0 | 0 | 0 | 0 | 0 (4) + 0 = 0 |
| 1 | 0 | 1 | 0 | 2 (4) + 2 = 10 |
| 0 | 1 | 0 | 1 | 1 (4) + 1 = 5 |
| 1 | 0 | 0 | 0 | 2 (4) + 0 = 8 |

Figure 5:
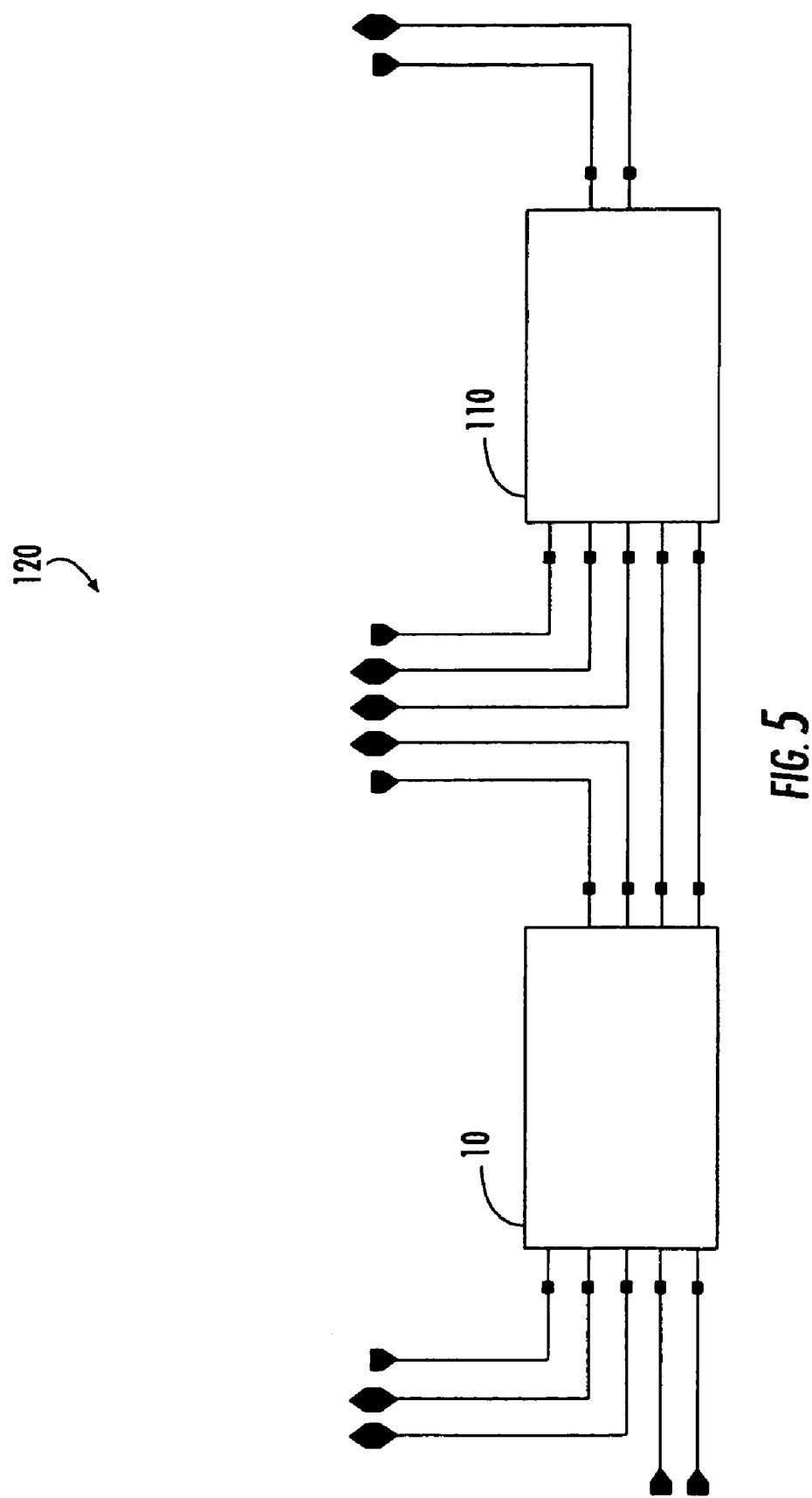
FIG. 5 is a high-level block diagram of an 8-bit programmable priority encoder block.

There are 4 blocks of 4 rows representing the most significant column. The carry outputs of the most significant column feeds the match input of the least significant column of an additional 4 blocks of 4 rows. Within each column, all four of the programmed priorities are used four times each, and yet a unique priority is produced when the two columns are cascaded. Continuing down the cascade from the most significant column to the least significant column, the more significant columns act as filters to subsequent lower significant columns. Further cascading is shown in the respective 6-bit programmable priority encoder 110 in FIG. 4, the 8-bit programmable priority encoder 120 in FIG. 5, and the 10-bit priority encoder 130 in FIG. 6. As illustrated, each is cascaded from the previous, such that the 6-bit cascades the 2-bit and 4-bit, the 8-bit cascades the 2-bit and 6-bit, and 10-bit cascades the 2-bit and 8-bit, as illustrated. The 10-bit programmable priority encoder 130 schematic represents a five column cascading and 1024 rows to be encoded.

Figure 7:
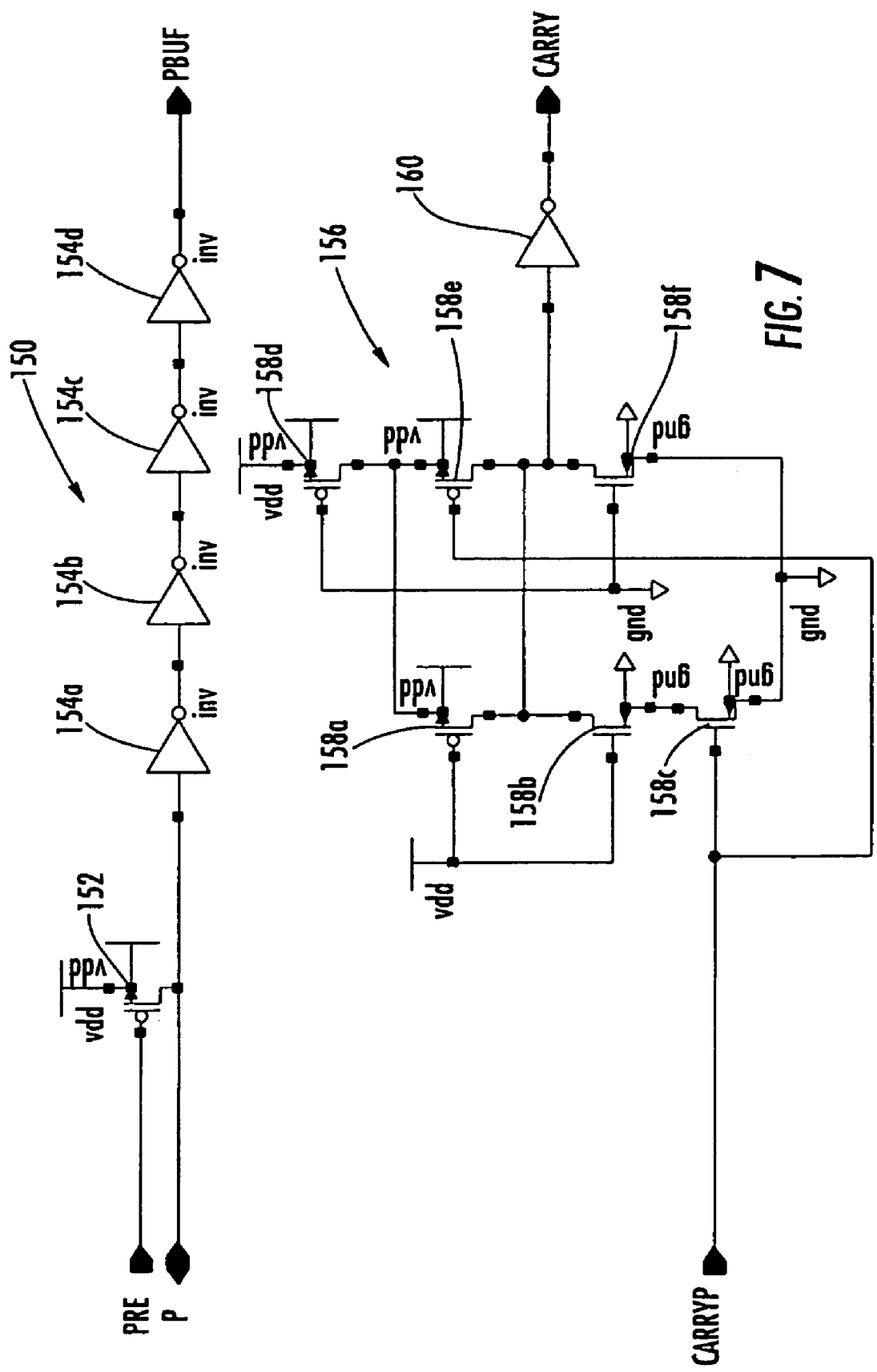
FIG. 7 is a schematic circuit diagram of a programmable priority encoder precharge cell in accordance with one embodiment of the present invention.

Referring now to FIG. 7, there is illustrated a programmable priority encoder precharge cell 150. Each (P) signal is precharged to a logic 1 at the beginning of an encoding cycle. The signal PRE is pulsed low prior to the beginning of an encoding cycle. A p-channel transistor 152 pulls signal P to the high rail (logic 2). The P signal is also buffered by 4 inverters 154a, producing a PBUF signal. This signal is used to drive the large load of many parallel encoder cells. A complex gate 156 similar to that used in the encoder cell 12 shown in FIG. 1 is also used. This complex gate 156 includes six transistors 158a–f and a logic inverter 160.

Figure 8A:
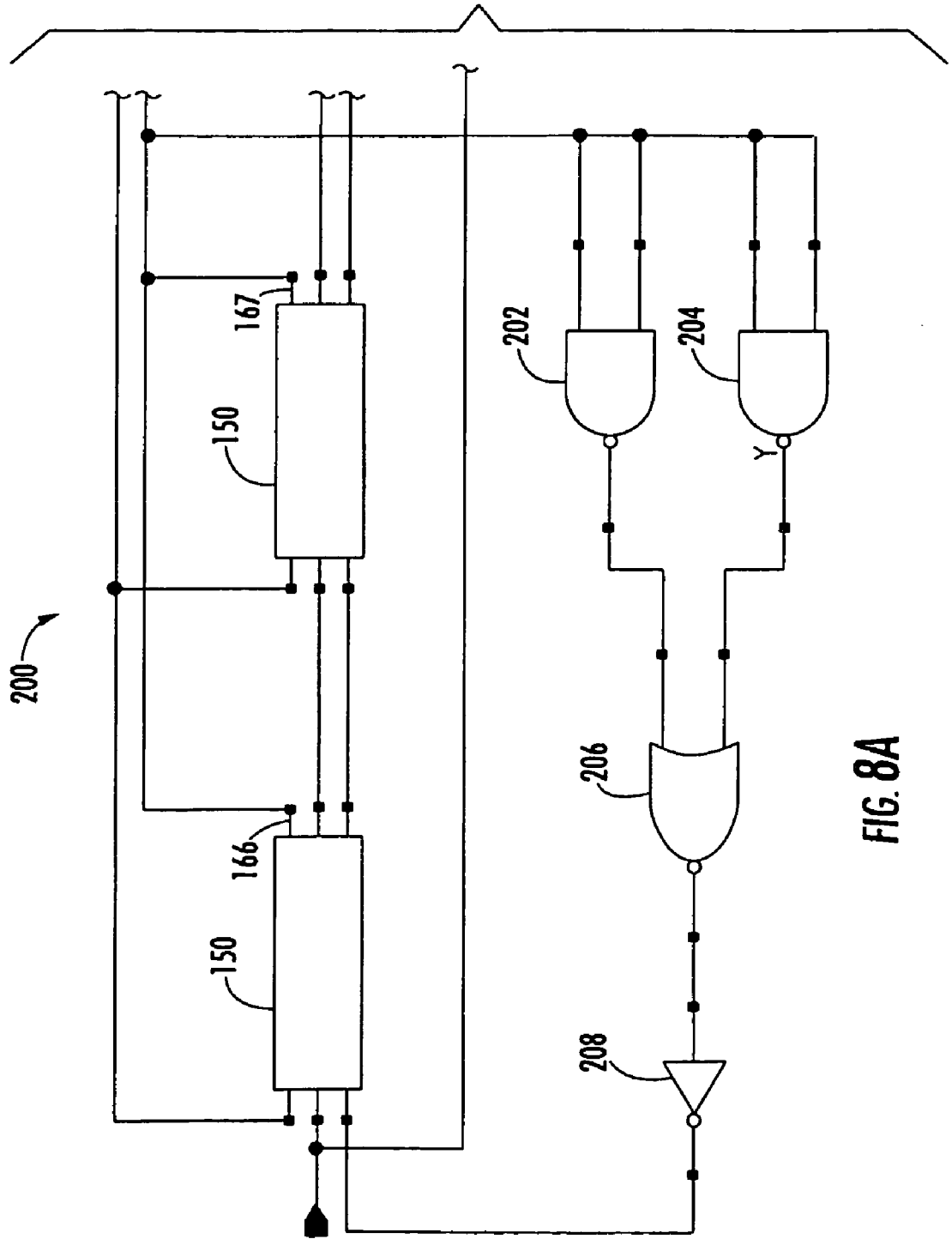
FIGS. 8A and 8B are schematic circuit diagrams of a 2-bit priority encoder precharge cell in accordance with an embodiment of the present invention.
Figure 8B:
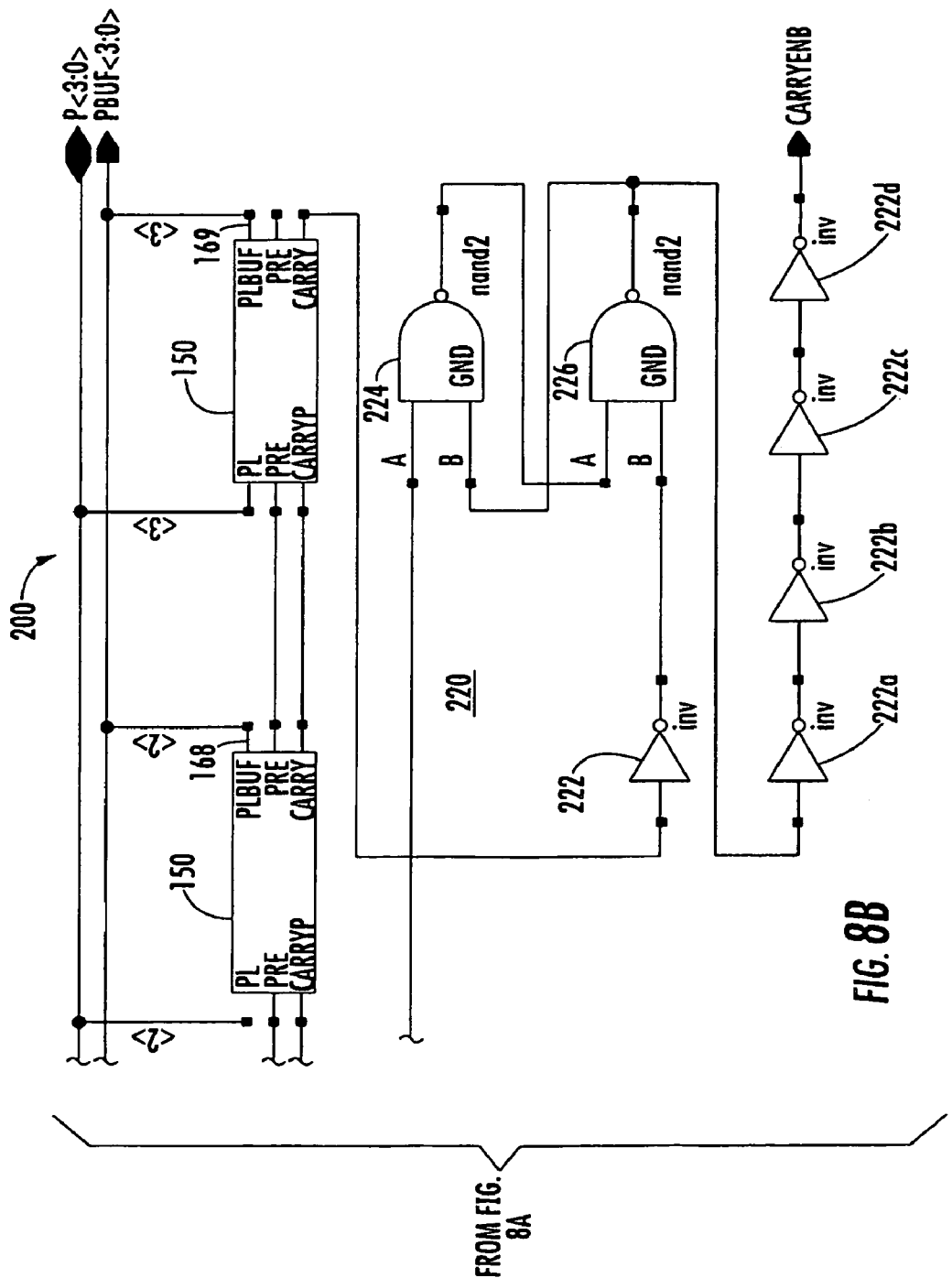

A 2-bit priority encoder precharge cell 200 is shown in FIGS. 8A and 8B and formed from four precharge cells 150 (FIG. 7) which are grouped together to match the four encoder cells of a 2-bit programmable priority encoder block 10 shown in FIGS. 2A–2B. These delays are summed up and used along with other timing circuits to produce an enable signal for subsequent columns in the cascade. Each encoder block takes a certain amount to time to propagate a result and this circuit 200 inhibits the final carry output for each row until the result has had time to propagate.

As illustrated in this circuit 200, two NAND gates 202 and 204, the NOR gate 206 and inverter 208 on the bottom left detect when any of the four PBUF signals change from logic 1 to logic 0. This indicates that the encoder cycle has begun and matched data has been applied to each row of the encoder. The output of this detector is fed into the first cell CARRYP input. It then propagates through each cell in the same way that the encoder cells propagate the CARRY. At the last cell the CARRY signal trips a buffered latch circuit 220 to indicate that enough propagation time has passed to allow settle data to start the next encoder column in the cascade. This circuit 220 includes an inverter 222, NAND gates 224 and 226, and four serially connected inverters 228a–d.

Figure 6:
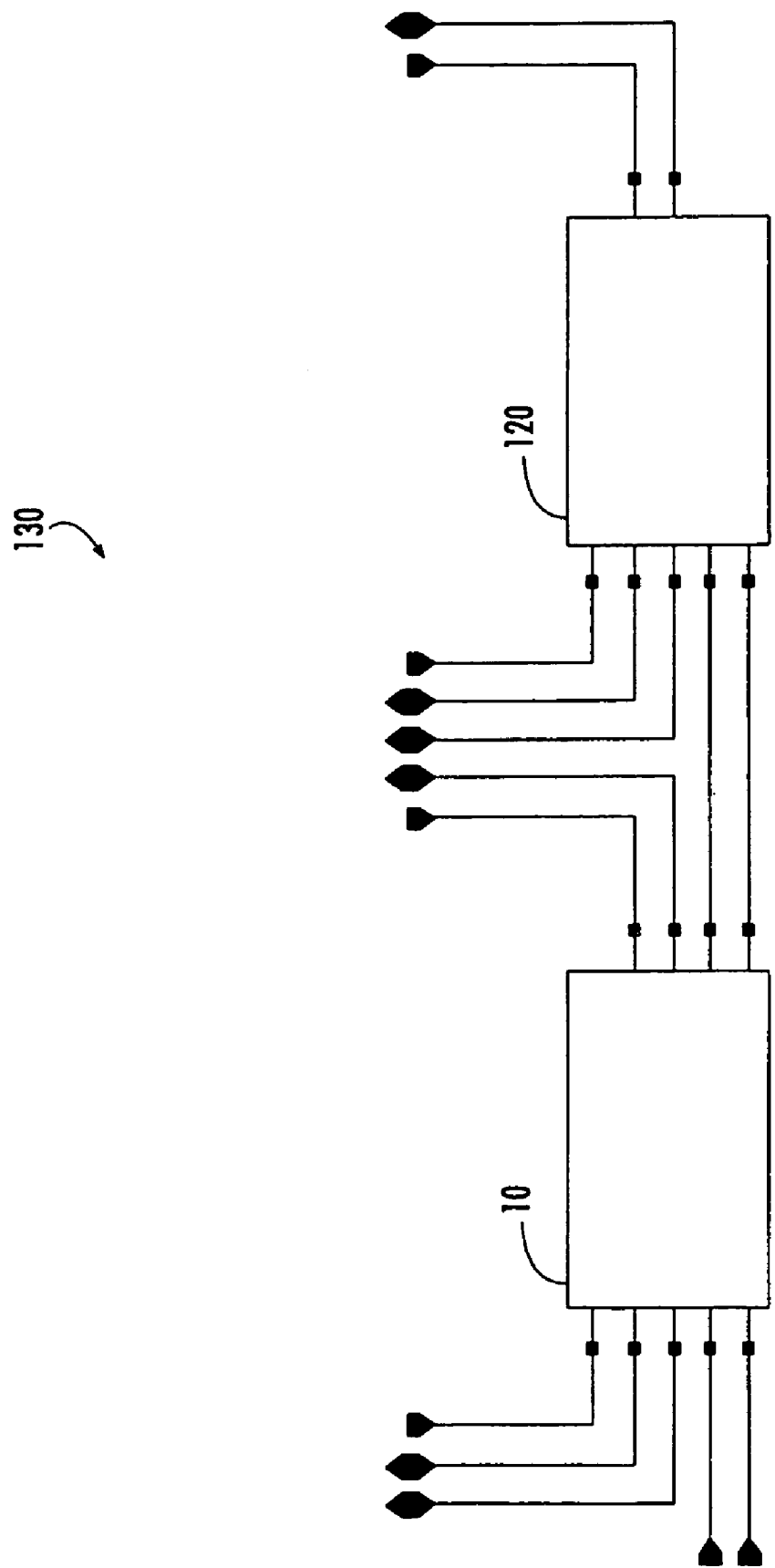
FIG. 6 is a high-level block diagram of a 10-bit programmable priority encoder block.

In the example provided there are 1024 rows and therefore 256 encoder blocks of 4 rows and 4 P signals in each column of the cascade. The P and PBUF signals run vertically and are connected between each encoder cell. This was illustrated in the 10-bit programmable priority encoder of FIG. 6, showing the 4 column (2-BIT) cascading used in the 1024 row encoder. A total of 4×5=20 P signals were used in this example.

A top-level schematic of a 1024 programmable priority encoder 270 shown in FIG. 10 uses the 10-bit programmable priority encoder block 130 shown in FIG. 6, combined with a precharge circuit and decode blocks. Five precharge blocks are added, one for each cascaded column. The PRE signal described above pulses prior to match data being applied to this encoder. The CARRY ENB<4:0> signals for each cascaded column regulate when the column is engaged as data propagates down the cascade.

Figure 9:
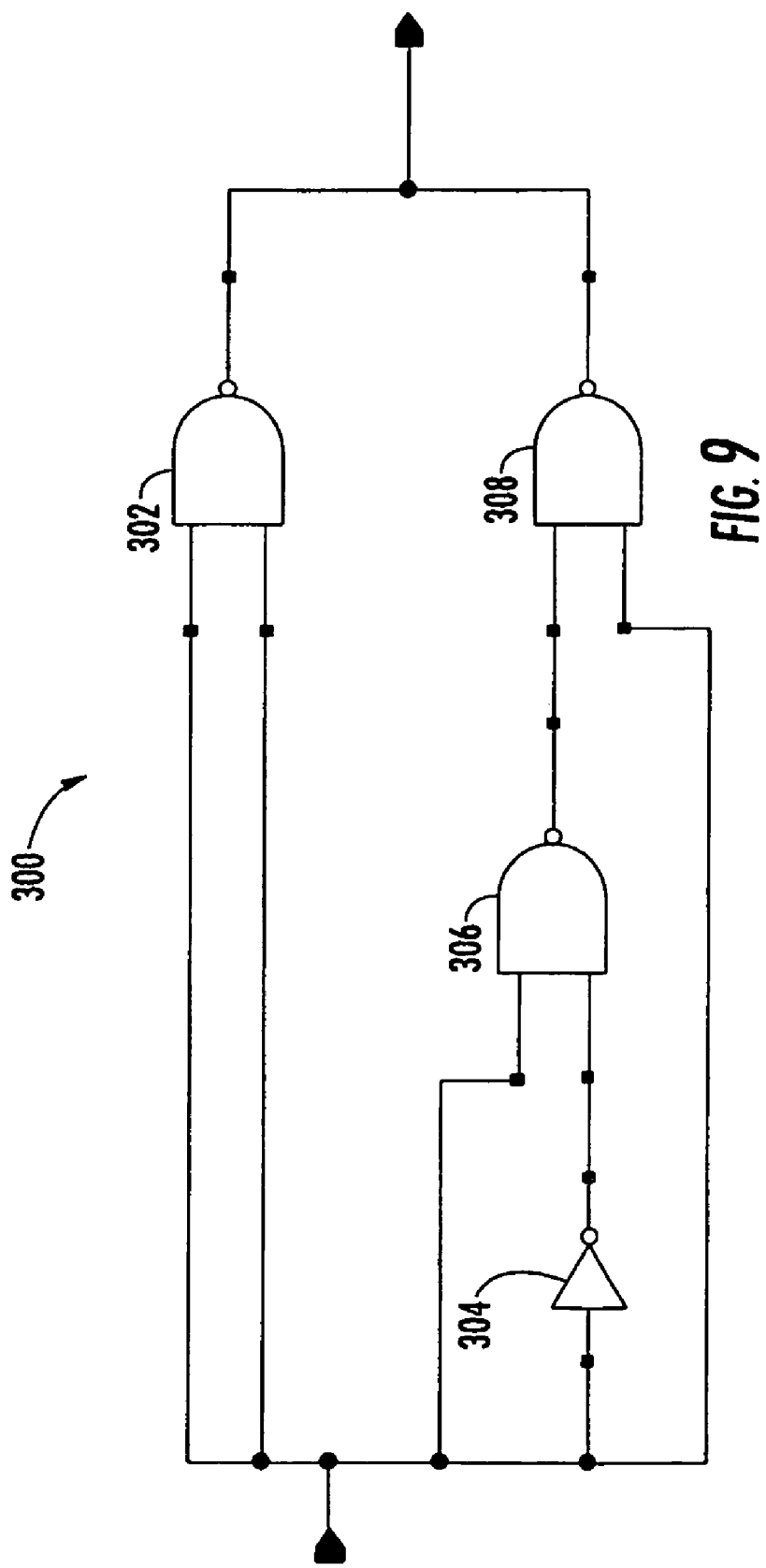
FIG. 9 is a schematic circuit diagram of a decoder circuit that can be used in the programmable priority encoder of the present invention.

The five decode blocks 300 are similar circuits as used with the physical priority encoder described in the '890 patent application. The (P) signals are translated into binary 2-bit addresses. For 1024 rows a total of 10 bits are produced based on the unique row that matched. FIG. 9 shows details of a decoder circuit 300, allowing an address conversion to be accomplished on each 2-bit encoder. This circuit includes an upper NAND gate 302 and a serially connected inverter circuit 304, NAND gate 306 and second NAND gate 308, forming dual NAND gates. Based on a highest discharge P bus, a binary address can be logically determined. This programmable priority encoder can be operative with the CAM cell array 272 to form a Content Addressable Memory (CAM) device. Of course, the programmable priority encoder as described can be used with any other type of device having a plurality of arrayed objects to be encoded in binary and arranged in rows and columns.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

What is claimed is:

1. A Content Addressable Memory (CAM) device comprising:

an array of CAM cells arranged in rows and columns, with each row operative to produce a match signal indicative that compare data has matched data within a respective row; and a programmable priority encoder operatively connected to said array of CAM cells for allowing priority to be assigned, said programmable priority encoder including a plurality of encoder cells each having a memory element and forming an encoder block and arranged in rows, each encoder cell including match lines and precharged bus lines operative with respective encoder cells and match lines, wherein precharged bus lines are discharged indicating a match and priority is assigned to rows based on logic values stored within memory elements of said encoder cells.

2. A CAM device according to claim 1, wherein said programmable priority encoder comprises a plurality of n-bit encoder blocks that are cascaded together.

3. A CAM device according to claim 1, wherein each memory element comprises an SRAM cell.

4. A CAM device according to claim 1, wherein each encoder cell further comprises a word line (WL), a bit line complement (BLC), and a bit line true (BLT) signal line, each operative with said memory element.

5. A CAM device according to claim 1, wherein each encoder cell further comprises a discharge circuit to ground and operative for receiving a precharged bus signal on the precharge bus line when a memory element associated therewith has a logic one and a match has occurred.

6. A CAM device according to claim 5, wherein said discharge circuit comprises series connected transistors.

7. A CAM device according to claim 1, wherein each encoder cell further comprises an AND/OR logic circuit operatively connected to said memory element for allowing a carry signal based on precharged bus line and memory element values.

8. A CAM device according to claim 1, wherein each encoder cell further comprises a buffer circuit associated with said memory element for buffering the value stored within said memory element.

9. A CAM device according to claim 1, and further comprising a precharge circuit operatively connected to said precharged bus lines for precharging the precharged bus lines and comprising a precharge cell associated with each precharged bus line.

10. A CAM device according to claim 9, and further comprising cascaded precharge cells.

11. A programmable priority encoder for use with a device having a plurality of array objects to be encoded in binary and arranged in rows and columns comprising:

a plurality of match lines adapted to be connected to a plurality of arrayed objects associated with respective rows;

a plurality of encoder cells, each having a memory element and forming an encoder block and arranged in rows; and precharged bus lines operative with said encoder cells and match lines, wherein precharged bus lines are discharged indicating a match and priority is assigned to rows based on logic values stored within said memory elements of said encoder cells.

12. A programmable priority encoder according to claim 11, wherein said programmable priority encoder comprises a plurality of n-bit encoder blocks that are cascaded together.

13. A programmable priority encoder according to claim 11, wherein each memory element comprises an SRAM cell.

14. A programmable priority encoder according to claim 11, wherein each encoder cell further comprises a word line (WL), a bit line complement (BLC), and a bit line true (BLT) signal line, each operative with said memory element.

15. A programmable priority encoder according to claim 11, wherein each encoder cell further comprises a discharge circuit to ground and operative for a receiving precharged bus signal on the precharged bus line when a memory element associated therewith has a logic one and a match has occurred.

16. A programmable priority encoder according to claim 15, wherein said discharge circuit comprises series connected transistors.

17. A programmable priority encoder according to claim 11, wherein each encoder cell further comprises an AND/OR logic circuit operatively connected to said memory element for allowing a carry signal based on precharged bus line and memory element values.

18. A programmable priority encoder according to claim 11, wherein each encoder cell further comprises a buffer circuit associated with said memory element for buffering the value stored within said memory element.

19. A programmable priority encoder according to claim 11, and further comprising a precharged bus circuit operatively connected to said precharged bus lines for precharging the precharged bus lines and comprising a precharge cell associated with each precharged bus line.

20. A programmable priority encoder according to claim 19, and further comprising cascaded precharge cells.

21. A programmable priority encoder for use with a device having a plurality of array objects to be encoded in binary and arranged in rows and columns comprising:
a plurality of match lines adapted to be connected to a plurality of arrayed objects associated with respective rows;
a plurality of encoder blocks cascaded together, each encoder block including a plurality of encoder cells arranged in rows and each having a memory element and each operative with a match line; and
precharged bus lines operative with said encoder cells and match lines, wherein precharged bus lines are discharged indicating a mach and priority is assigned to rows based on logic values stored within said memory elements of said encoder cells.

22. A programmable priority encoder according to claim 21, wherein said memory element comprises an SRAM cell.

23. A programmable priority encoder according to claim 21, wherein each encoder cell further comprises a word line (WL), a bit line complement (BLC), and a bit line true (BLT) signal line, each operative with said memory element.

24. A programmable priority encoder according to claim 21, wherein each encoder cell further comprises a discharge circuit to ground and operative for a receiving precharged bus signal on the precharged bus line when a memory element associated therewith has a logic one and a match has occurred.

25. A programmable priority encoder according to claim 24, wherein said discharge circuit comprises series connected transistors.

26. A programmable priority encoder according to claim 21, wherein each encoder cell further comprises an AND/OR logic circuit operatively connected to said memory element for allowing a carry signal based on precharged bus line and memory element values.

27. A programmable priority encoder according to claim 21, wherein each encoder cell further comprises a buffer circuit associated with said memory element for buffering the value stored within said memory element.

28. A programmable priority encoder according to claim 21, and further comprising a precharge circuit operatively connected to said precharged bus lines for precharging the precharged bus lines and comprising cascaded precharge cells associated with said precharged bus lines.

29. A programmable priority encoder according to claim 21, and further comprising cascaded precharge cells.

* * * * *

UNITED STATES PATENT AND TRADEMARK OFFICE
CERTIFICATE OF CORRECTION

PATENT NO. : 7,196,922 B2  Page 1 of 1
APPLICATION NO. : 11/188396
DATED : March 27, 2007
INVENTOR(S) : Mark Lysinger It is certified that error appears in the above-identified patent and that said Letters Patent is hereby corrected as shown below:

Column 5, Line 30    Delete: "then"
                     Insert: --than--

Column 12, Line 3    Delete: "mach"
                     Insert: --match--

Signed and Sealed this

Eighteenth Day of November, 2008

JON W. DUDAS
*Director of the United States Patent and Trademark Office*